United States Patent
Simpson et al.

[11] Patent Number: 5,891,581
[45] Date of Patent: Apr. 6, 1999

[54] THERMALLY STABLE, PIEZOELECTRIC AND PYROELECTRIC POLYMERIC SUBSTRATES

[75] Inventors: Joycelyn O. Simpson, Hampton; Terry L. St. Clair, Poquoson, both of Va.

[73] Assignee: The United States of America as represented by the Administrator of the National Aeronautics and Space Administration, Washington, D.C.

[21] Appl. No.: 524,855

[22] Filed: Sep. 7, 1995

[51] Int. Cl.[6] ..................................................... H01L 41/04
[52] U.S. Cl. ........................ 428/458; 428/473.5; 310/311; 310/800
[58] Field of Search ..................................... 310/800, 311; 428/457, 458, 473.5, 412; 528/188; 427/100, 125, 123, 372.2

[56] References Cited

U.S. PATENT DOCUMENTS

| | | | |
|---|---|---|---|
| 4,375,042 | 2/1983 | Marcus | 310/357 |
| 4,651,310 | 3/1987 | Kaneko et al. | 367/140 |
| 4,701,659 | 10/1987 | Fujii et al. | 310/334 |
| 4,830,795 | 5/1989 | Scheinbeim et al. | 264/435 |
| 4,863,648 | 9/1989 | Scheinbeim et al. | 264/430 |
| 4,959,439 | 9/1990 | Tanino et al. | 528/111 |
| 5,288,551 | 2/1994 | Sato et al. | 428/334 |
| 5,302,692 | 4/1994 | St Clair et al. | 528/373 |
| 5,354,839 | 10/1994 | Yamashita et al. | 528/188 |

*Primary Examiner*—Paul Thibodeau
*Assistant Examiner*—D. Lawrence Tarazano
*Attorney, Agent, or Firm*—Hillary T. Womack

[57] ABSTRACT

A thermally stable, piezoelectric and pyroelectric polymeric substrate was prepared. This thermally stable, piezoelectric and pyroelectric polymeric substrate may be used to prepare electromechanical transducers, thermomechanical transducers, accelerometers, acoustic sensors, infrared sensors, pressure sensors, vibration sensors, impact sensors, in-situ temperature sensors, in-situ stress/strain sensors, micro actuators, switches, adjustable fresnel lenses, speakers, tactile sensors, weather sensors, micro positioners, ultrasonic devices, power generators, tunable reflectors, microphones, and hydrophones. The process for preparing these polymeric substrates includes: providing a polymeric substrate having a softening temperature greater than 100° C.; depositing a metal electrode material onto the polymer film; attaching a plurality of electrical leads to the metal electrode coated polymeric substrate; heating the metal electrode coated polymeric substrate in a low dielectric medium; applying a voltage to the heated metal electrode coated polymeric substrate to induce polarization; and cooling the polarized metal electrode coated polymeric electrode while maintaining a constant voltage.

6 Claims, 1 Drawing Sheet

THERMALLY STABLE, PIEZOELECTRIC AND PYROELECTRIC POLYMERIC SUBSTRATES

ORIGIN OF THE INVENTION

The invention described herein was made by employees of the United States Government and may be manufactured and used by or for the Government without payment of any royalties thereon or therefor.

BACKGROUND OF THE INVENTION

1. Field of the Invention

This invention relates to thermally stable polymeric substrates which exhibit piezoelectric and pyroelectric properties. In particular, it relates to thermally stable, piezoelectric and pyroelectric polymeric substrates which do not require polarization solvents or mechanical orientation to prepare them.

2. Description of the Related Art

Production of an electric voltage in response to mechanical excitation (piezoelectricity) or thermal excitation (pyroelectricity) requires a material to have a preferred dipole orientation in its structure. This preferred orientation or polarization occurs naturally in some crystals such as quartz and can be induced into some ceramic and polymeric materials by application of strong electric or mechanical fields. For some materials, a combination of mechanical and electrical orientation is necessary to completely polarize the material. Such is the case for the only commercially available piezoelectric polymer, poly(vinylidene fluoride) ($PVF_2$).

Poly(vinylidene fluoride) is a highly crystalline material (40–60%) possessing at least three major crystal forms: $\alpha$-form, $\beta$-form, and $\gamma$-form. Of these forms, only the $\beta$-form can be polarized to exhibit significant piezoelectric or pyroelectric responses. The $\beta$-form of crystallinity is induced by drawing the $PVF_2$ sheet at a temperature of approximately 70°°C. to several times its original length. This produces a morphology that has vinylidene fluoride groups aligned in an orthorhombic, planar zigzag conformation.

When the $PVF_2$ is subsequently poled in a DC field of at least 100 MV/m, the molecular dipoles (negatively charged fluorine atoms and positively charged hydrogen atoms) will orient perpendicular to the plane of the film producing a net dipole in the field direction. This process is known as poling.

After poling, the crystalline phase in the $PVF_2$ serves as a structural support for the induced polarization. It is widely considered that crystallinity is a necessary morphological feature for making a stable polarized material.

However, material and process limitations prohibit the use of $PVF_2$ in numerous device applications, particularly where thermal stability is required. At temperatures significantly above the glass transition temperature of the non-crystalline regions of $PVF_2$, the polarization induced in the poling process is randomized. This dipole randomization occurs around 60°°C. and is accompanied by a tremendous loss in the induced polarization. This destroys or significantly decreases the desired piezoelectric and pyroelectric properties. Moreover, the need to mechanically draw the film prior to electrical poling presents a significant disadvantage in that drawing in the film direction causes an anisotropic elastic modulus in the stretching or axial direction as compared to the transverse direction.

Scheinbeim et al. (U.S. Pat. Nos. 4,830,795 and 4,863,648) disclose a process for making polarized material which does not require mechanical drawing. In their process, polarized material is prepared by applying an electrical field to a material in a polarization solvent. During poling the solvent is removed from the material to the desired extent or totally to provide a polarized material which is substantially free of mechanically induced orientation. This process has been used to pole $PVF_2$ and nylon materials such as Nylon 7 and Nylon 11. However, this process is only suitable for polymers which are soluble in an appropriate polarization solvent. This process cannot be used for polymers which are not soluble in a polarization solvent.

Improper removal of the solvent from the polarization material also adversely affects the final product. If the percentage of solvent remaining in the poled material is too large, the enhanced mobility of the material may actually promote randomization of the dipolar units leading to lower desired polarization properties.

Lastly, the use of solvent dictates the conditions of the process. For example, the temperature at which the solvent is removed must be well below the degradation temperature of the polymer. In addition, the poling temperature must be lower than the boiling point of the solvent.

An object of the present invention is to provide a polymeric substrate which is thermally stable and exhibits piezoelectric and pyroelectric properties.

Another object of the invention is to provide a process for preparing a thermally stable polymeric substrate which exhibits piezoelectric and pyroelectric properties without requiring mechanical orientation.

Another object of the invention is to provide a process for preparing a thermally stable polymeric substrate which exhibits piezoelectric and pyroelectric properties without requiring the use of solvents.

SUMMARY OF THE INVENTION

By the present invention, thermally stable, piezoelectric and pyroelectric polymeric substrates were prepared. These polymeric substrates retain their orientation, piezoelectric and pyroelectric properties at temperatures greater than about 100° C. up to the softening temperature of the polymer. They have an advantage over piezoelectric inorganic materials because they are easily processable and conformable to a variety of different shapes. As a result of these properties, these polymeric substrates may be used for many applications such as: an electromechanical transducer, a thermomechanical transducer, an accelerometer, an acoustic sensor, an infrared sensor, a pressure sensor, a vibration sensor, an impact sensor, an in-situ temperature sensor, an in-situ stress/strain sensor, a micro actuator, a switch, an adjustable fresnel lense, a speaker, a tunable reflector, a microphone, a tactile sensor, a weather sensor, a micropositioner, an ultrasonic device, and a power generator.

The thermally stable, piezoelectric and pyroelectric polymeric substrate comprises: a polymeric substrate having a softening temperature greater than about 100° C.; a metal electrode material deposited onto the polymeric substrate to form a metal electrode coated polymeric substrate; and a polar field applied to the metal electrode coated polymeric substrate. The polar field is applied to the metal electrode coated polymeric substrate by attaching a plurality of electrical leads to the metal electrode coated polymeric substrate and heating the metal electrode coated polymeric substrate in a low dielectric medium to about the softening temperature of the polymeric substrate. A voltage is applied to the heated metal electrode coated polymeric substrate to induce polarization. The voltage applied is less than the voltage wherein dielectric breakdown occurs in the metal electrode coated polymeric substrate. The polarized metal electrode coated polymeric substrate is then cooled to a temperature below the softening temperature of the polymeric substrate while maintaining a constant voltage.

DESCRIPTION OF THE PREFERRED EMBODIMENTS

Figure 1:
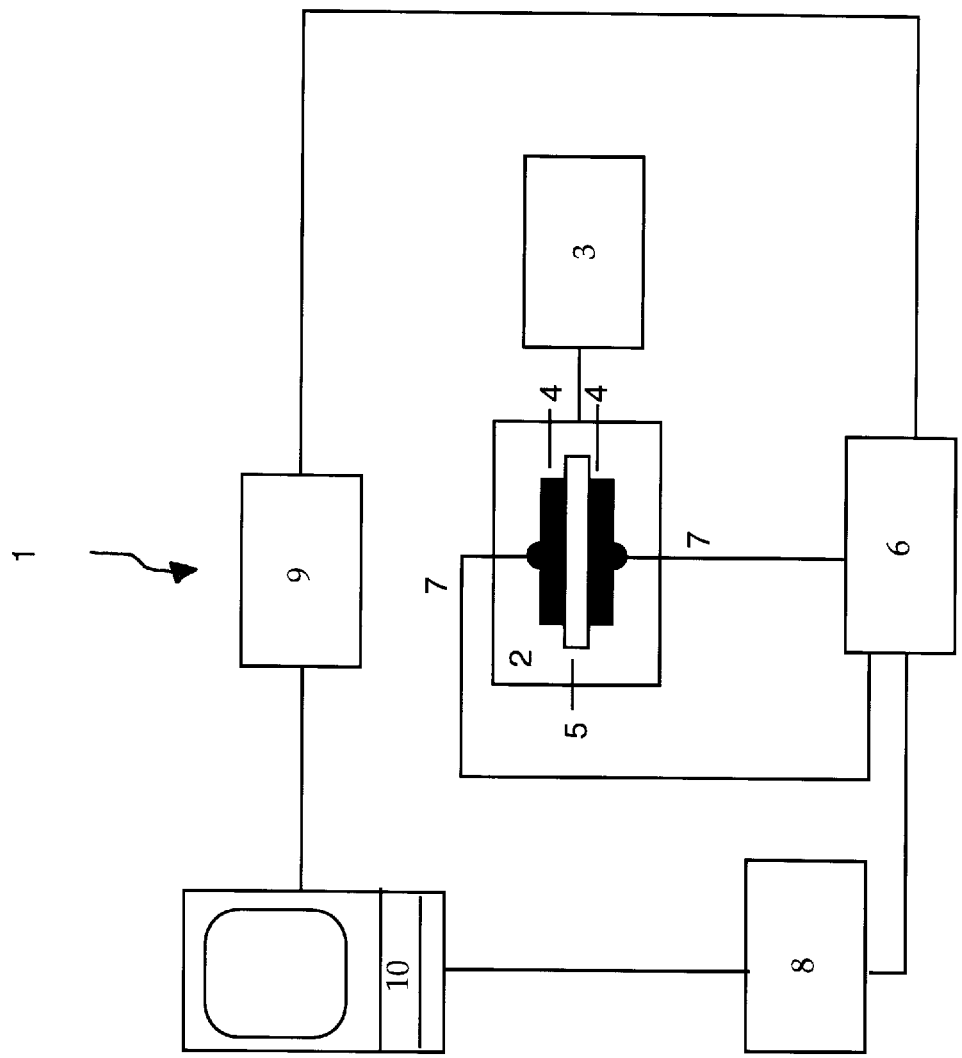
FIG. 1 is a diagram of the poling apparatus.

The thermally stable, piezoelectric and pyroelectric polymeric substrates of the present invention can be prepared from a variety of polymers such as polyarylates, polyquinoxalines, polyphenylene ethers, polycarbonates, polyphenylene sulfides, polysulfones, polyaryletherketones, polyimides, polyarylene ethers, polybenzimidazoles, polyazomethines and any other thermally stable polymers known to those skilled in the art. Of particular interest, are those polymers which have the structural repeat unit:

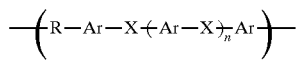

wherein R is selected from the group consisting of:

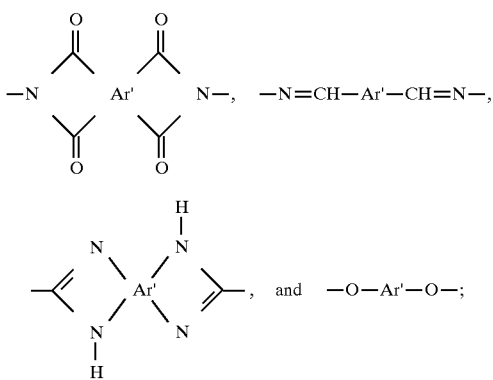

and as a preferred embodiment, R is:

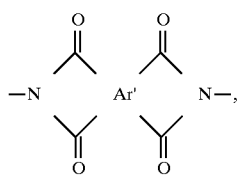

Ar' is selected from the group consisting of: any aromatic moiety and any aromatic moiety having a polarizable group. As a preferred embodiment, Ar' is a member selected from the group consisting of:

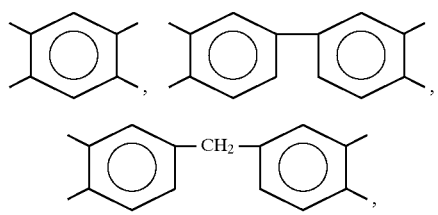

-continued

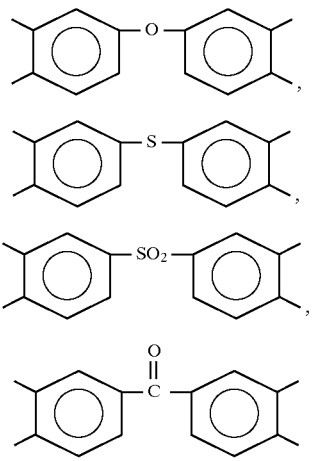

As a most preferred embodiment, Ar' is:

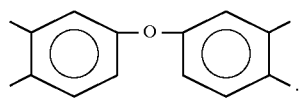

Ar is:

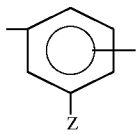

wherein the catenation is ortho, para, or meta. Z is hydrogen or Q—Y and Q is a direct bond or any aromatic moiety. As a preferred embodiment, Q is a direct bond. Y is a radical having a polarizable group. A polarizable group is defined as a group having a dipole moment. As a preferred embodiment, Y is selected from the group consisting of —$CF_3$, —CN, —$NO_2$, and —$SF_5$. As a most preferred embodiment, Y is —CN.

X is any linking group known to those skilled in the art. In particular, X is selected from the group consisting of —O—, —CO—, —$SO_2$—, and —$CH_2$—. As a most preferred embodiment, X is defined as —O—.

n is an integer ranging from about 1 to about 10. As a preferred embodiment, n is 1.

Care must be taken in preparing polymeric substrates for high voltage processing in order to avoid excessive arcing of the substrate. It has been found that ultra-filtration of the precursor materials along with casting and curing the substrate in a particulate free environment is useful to minimize particulate contamination and point defects.

The thermally stable, piezoelectric and pyroelectric polymeric substrate further comprises a metal electrode material deposited onto the polymeric substrate to form a metal electrode coated polymeric substrate. The metal electrode material may be any metal material known to those skilled in the art such as gold or silver that is of low resistivity and does not produce oxides at elevated temperatures. Gold is the preferred metal electrode material for the present invention. The metal electrode material may be applied to the film at opposing, overlapping surfaces by either sputtering or evaporating as a thin sheet. As a preferred embodiment, the metal electrode material is deposited by evaporating as a thin sheet.

Lastly, the thermally stable, piezoelectric and pyroelectric polymeric substrate comprises a polar field such as an electric field, a magnetic field or a combination thereof. The polar field is applied to the metal electrode coated polymeric substrate by heating the metal electrode coated polymeric substrate in a low dielectric medium to about the softening temperature of the polymer. Any low dielectric medium known to those skilled in the art such as a silicone oil medium may be used. The metal electrode coated polymeric substrate is heated to a temperature in the vicinity of its softening temperature to increase the molecular mobility of the polymer and thus facilitating poling of the polymer. In some cases, field sweeping of ionic impurities by applying a low static voltage for an extended period of time is necessary to minimize conduction current during poling. A voltage is applied to the heated metal electrode coated polymeric substrate to induce polarization wherein the voltage is less than the voltage wherein dielectric breakdown occurs in the metal electrode coated polymeric substrate. The voltage may be either a low frequency biased AC voltage or a DC voltage applied at a range from about 50 MV/m to about 200 MV/m. As a preferred embodiment, a DC voltage applied at a range from about 100 MV/m to about 200 MV/m was found to provide good results. The best results occurred when a DC voltage of 100 MV/m was applied. This voltage or field strength was found to be suitable to induce preferential alignment of the molecular dipoles. The voltage is maintained for a period of time which is sufficient to obtain the desired degree of polarization of the polymeric substrate. The polarized metal electrode coated polymeric substrate is then cooled while maintaining a constant voltage to a temperature below the softening temperature of the polymer. This allows the induced orientation to become "frozen" or preserved. As a preferred embodiment, this temperature is 80°°C.

These resulting thermally stable, piezoelectric and pyroelectric polymeric substrates can be used to prepare a variety of articles. These articles are selected from the group consisting of: electromechanical transducers, thermomechanical transducers, accelerometers, acoustic sensors, infrared sensors, pressure sensors, vibration sensors, impact sensors, in-situ temperature sensors, in-situ stress/strain sensors, micro actuators, switches, adjustable fresnel lenses, speakers, tunable reflectors, microphones, hydrophones, tactile sensors, weather sensors, micro positioner, ultrasonic devices, and power generators.

Referring now to the drawing. FIG. 1 depicts the poling apparatus 1 of the present invention. A low dielectric medium 2 is heated to about the softening temperature of the polymeric substrate using a temperature controller 3. The metal electrode material 4 is coated onto a polymeric substrate 5 and the metal electrode coated polymeric substrate 5 is placed in the heated low dielectric medium 2. A high voltage source 6 is connected to the metal electrodes 4 using electrical leads 7. The current generated by the metal electrode coated polymeric substrate 5 in response to the applied voltage is monitored by the current meter 8. Data from the current meter 8 and the voltage meter 9 is relayed to the computer 10.

The following examples illustrate the process of the present invention. These examples are merely illustrative and intended to enable those skilled in the art to practice the invention in all of the embodiments flowing therefrom, and do not in any way limit the scope of the invention as defined by the claims.

EXAMPLES

Example 1

A 1 mil thick polyimide film having the following repeat unit:

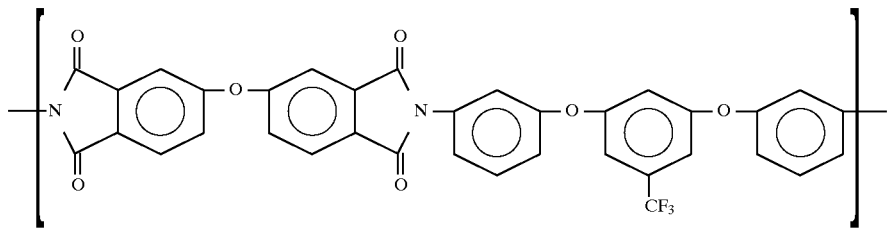

and a glass transition temperature of 175°°C. was prepared and evaporated with a 2000 Angstrom layer of silver as an electrode material. The electroded surface area measured approximately 144 mm². The film was placed in a silicone oil medium in a poling apparatus of the type shown in FIG. 1 and connected to a high voltage DC source. The film in the silicone oil medium was heated to 165°°C. and a DC voltage of 120 MV/m was applied and maintained for approximately 15 minutes. Subsequently, the temperature was allowed to cool to ambient while the voltage was held constant at 120 MV/m. The electric field was reduced to zero when the temperature was within 10° C. of ambient.

The polarized film was analyzed for a piezoelectric response by applying a compressive force ranging from 5 to 200 lbs and measuring the voltage generated. The film was found to exhibit a piezoelectric response where the unpolarized film prepared from the same polymer did not exhibit a piezoelectric response.

The pyroelectric response was measured by connecting the film to a Fluke 87 multi meter and heating the film with a heat gun. An average maximum output voltage equal to 200 mV was achieved upon heating the sample to approximately 150° C. The maximum detectable voltage level using a Fluke 87 multi meter is 400 mV. Only minimal output voltage was achieved upon heating an unpolarized sample prepared from the same polymer.

Example 2

A 1 mil thick polyimide film having the repeat unit:

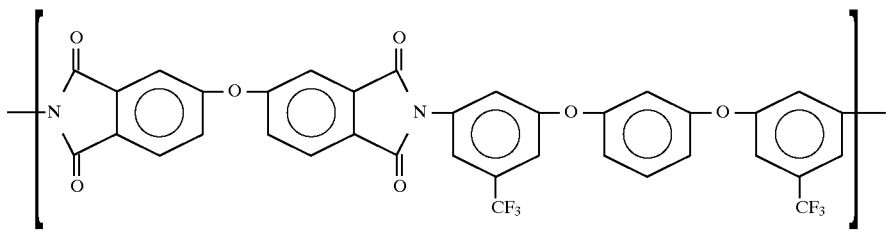

and a glass transition temperature of 180°°C. was prepared and evaporated with a 2000 Angstrom layer of silver as an electrode material. The electroded surface area measured approximately 144 mm². The film was placed in a silicone oil medium in a poling apparatus of the type shown in FIG. 1 and connected to a high voltage DC source. The film in the silicone oil medium was heated to 170°°C. and a DC voltage of 120 MV/m was applied and maintained for approximately 15 minutes. Subsequently, the temperature was allowed to cool to ambient while the voltage was held constant at 120 MV/m. The electric field was reduced to zero when the temperature was within 10° C. of ambient.

The polarized film was analyzed for a piezoelectric response by applying a compressive force ranging from 5 to 200 lbs and measuring the voltage generated. The film was found to exhibit a piezoelectric response where the unpolarized film prepared from the same polymer did not exhibit a piezoelectric response.

The pyroelectric response was measured by connecting the film to a Fluke 87 multi meter and heating the film with a heat gun. An average maximum output voltage in excess of 400 mV was achieved upon heating the sample to approximately 150°°C. The maximum detectable voltage level using a Fluke 87 multi meter is 400 mV. Only minimal output voltage was achieved upon heating an unpolarized sample prepared from the same polymer.

Example 3

A 1 mil thick polyimide film having the repeat unit:

oil medium in a poling apparatus of the type shown in FIG. 1 and connected to a high voltage DC source. The film in the silicone oil medium was heated to 165°°C. and a DC voltage of 120 MV/m was applied and maintained for approximately 15 minutes. Subsequently, the temperature was allowed to cool to ambient while the voltage was held constant at 120 MV/m. The electric field was reduced to zero when the temperature was within 10°°C. of ambient.

The polarized film was analyzed for a piezoelectric response by applying a compressive force ranging from 5 to 200 lbs and measuring the voltage generated. The film was found to exhibit a piezoelectric response where the unpolarized film prepared from the same polymer did not exhibit a piezoelectric response.

The pyroelectric response was measured by connecting the film to a Fluke 87 multi meter and heating the film with a heat gun. An average maximum output voltage in excess of 400 mV was achieved upon heating the sample to approximately 150°°C. The maximum detectable voltage level using a Fluke 87 multi meter is 400 mV. Only minimal output voltage was achieved upon heating an unpolarized sample prepared from the same polymer.

Example 4

A 1 mil thick polyimide film having the repeat unit:

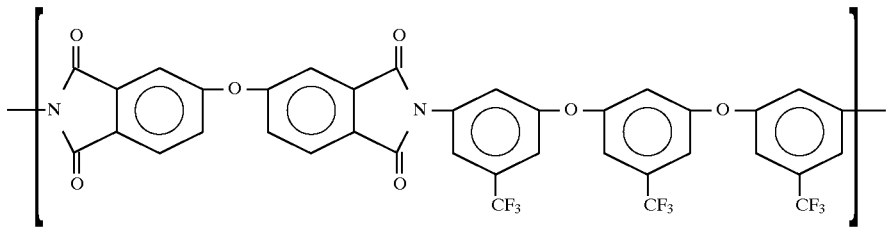

and a glass transition temperature of 176°°C. was prepared and evaporated with a 2000 Angstrom layer of silver as an electrode material. The electroded surface area measured approximately 144 mm². The film was placed in a silicone

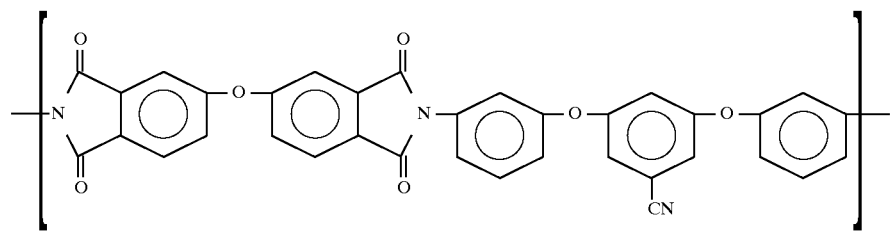

and a glass transition temperature of 220°°C. was evaporated with a 2000 Angstrom layer of silver as an electrode material. The electroded surface area measured approximately 144 mm². The film was placed in a silicone oil medium in a poling apparatus of the type shown in FIG. 1 and connected to a high voltage DC source. The film in the silicone oil medium was heated to 210°°C. and a DC voltage of 120 MV/m was applied and maintained for approximately 15 minutes. Subsequently, the temperature was allowed to cool to ambient while the voltage was held constant at 120 MV/m. The electric field was reduced to zero when the temperature was within 10°°C. of ambient.

The polarized film was analyzed for a piezoelectric response by applying a compressive force ranging from 5 to 200 lbs and measuring the voltage generated. The film was found to exhibit a piezoelectric response where the unpolarized film prepared from the same polymer did not exhibit a piezoelectric response.

The pyroelectric response was measured by connecting the film to a Fluke 87 multi meter and heating the film with a heat gun. An average maximum output voltage in excess of 400 mV was achieved upon heating the sample to approximately 150°°C. The maximum detectable voltage level using a Fluke 87 multi meter is 400 mV. Only minimal output voltage was achieved upon heating an unpolarized sample prepared from the same polymer.

What is claimed is:

1. A thermally stable, piezoelectric and pyroelectric polymeric substrate comprising:

(a) a polymeric member having a softening temperature greater than about 100° C. wherein said member has the repeat unit:

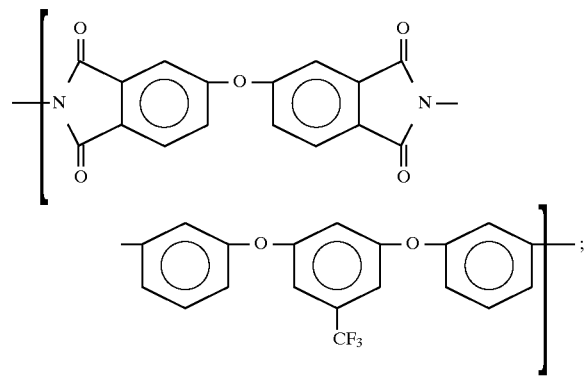

and (b) a metal electrode material deposited onto the polymeric member to form a metal electrode coated polymeric substrate wherein a polar field is applied to the metal electrode coated polymeric substrate;

wherein said substrate remains stable at temperatures above about 100° C. up to about the softening temperature of the polymeric member.

2. A thermally stable, piezoelectric and pyroelectric polymeric substrate comprising:

(a) a polymeric member having a softening temperature greater than about 100° C. wherein said member has the repeat unit;

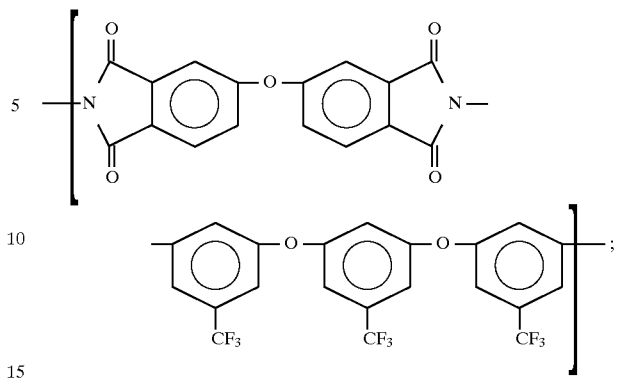

and (b) a metal electrode material deposited onto the polymeric member to form a metal electrode coated polymeric substrate wherein a polar field is applied to the metal electrode coated polymeric substrate;

wherein said substrate remains stable at temperatures above about 100° C. up to about the softening temperature of the polymeric member.

3. A thermally stable, piezoelectric and pyroelectric polymeric substrate comprising:

(a) a polymeric member having a softening temperature greater than about 100° C. wherein said member has the repeat unit;

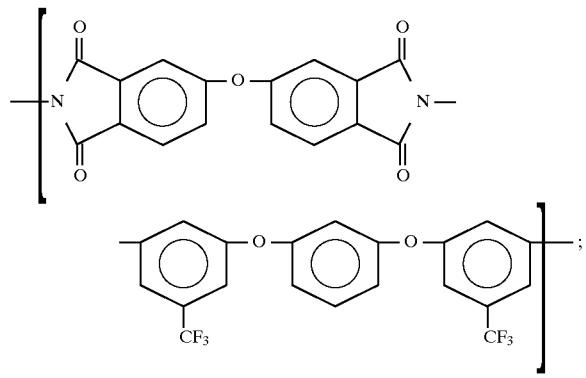

and (b) a metal electrode material deposited onto the polymeric member to form a metal electrode coated polymeric substrate wherein a polar field is applied to the metal electrode coated polymeric substrate;

wherein said substrate remains stable at temperatures above about 100° C. up to about the softening temperature of the polymeric member.

4. A thermally stable, piezoelectric and pyroelectric polymeric substrate comprising:

(a) a polymeric member having a softening temperature greater than about 100° C. wherein said member has the repeat unit;

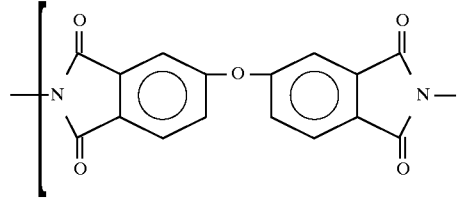

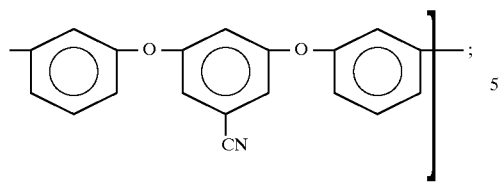

and

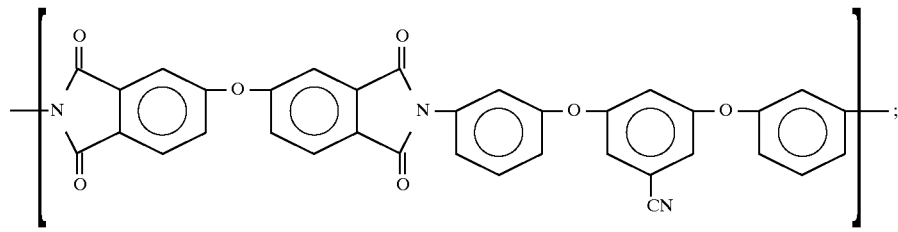

(b) a metal electrode material deposited onto the polymeric member to form a metal electrode coated polymeric substrate wherein a polar field is applied to the metal electrode coated polymeric substrate;

wherein said substrate remains stable at temperatures above about 100° C. up to about the softening temperature of the polymeric member.

5. A thermally stable, piezoelectric and pyroelectric polymer film wherein said film remains stable at temperatures above 100° C. to about 220° C. comprising:

a) a polymer film having a glass transition temperature of about 220° C., wherein the polymer film has the structural repeat unit:

b) a gold metal electrode material evaporated onto the polymer film to form a gold metal electrode coated polymer film wherein a polar field is applied to the gold metal electrode coated polymer film.

6. An article prepared from the thermally stable piezoelectric polymer film according to claim 5, wherein the article is selected from the group consisting of: an electromechanical transducer, a thermomechanical transducer, an accelerometer, an acoustic sensor, an infrared sensor, a pressure sensor, a vibration sensor, an impact sensor, an in-situ temperature sensor, an in-situ stress/strain sensor, a micro actuator, a switch, an adjustable fresnel lense, a speaker, a tunable reflector, a microphone, a tactile sensor, a weather sensor, a micropositioner, an ultrasonic device, a power generator and a hydrophone.

* * * * *